(12) United States Patent
Lee

(10) Patent No.: US 6,355,519 B1
(45) Date of Patent: Mar. 12, 2002

(54) METHOD FOR FABRICATING CAPACITOR OF SEMICONDUCTOR DEVICE

(75) Inventor: Kee-jeung Lee, Seoul (KR)

(73) Assignee: Hyundai Electronics Industries Co., Ltd., Kyunggi-do (KR)

( * ) Notice: Subject to any disclaimer, the term of this patent is extended or adjusted under 35 U.S.C. 154(b) by 0 days.

(21) Appl. No.: 09/474,676

(22) Filed: Dec. 29, 1999

(30) Foreign Application Priority Data

Dec. 30, 1998 (KR) .............................. 98 62468

(51) Int. Cl.[7] .......................................... H01L 21/8242
(52) U.S. Cl. .................. 438/250; 438/393; 438/252; 438/253; 438/254; 438/394; 438/3
(58) Field of Search ................... 438/239, 240, 438/250, 254, 252, 253, 393, 394, 3

(56) References Cited

U.S. PATENT DOCUMENTS

| | | | |
|---|---|---|---|
| 5,231,306 A | | 7/1993 | Meikle et al. .............. 257/751 |
| 5,525,542 A | | 6/1996 | Maniar et al. .............. 437/186 |
| 5,677,226 A | * | 10/1997 | Ishitani ........................ 437/60 |
| 5,729,054 A | | 3/1998 | Summerfelt et al. ........ 257/751 |
| 5,980,983 A | * | 11/1999 | Gordon ....................... 427/226 |
| 6,080,623 A | * | 6/2000 | Ono ............................ 438/254 |
| 6,124,626 A | * | 9/2000 | Sandhu et al. .............. 257/532 |
| 6,162,681 A | * | 12/2000 | Wu ............................. 438/256 |

* cited by examiner

*Primary Examiner*—John F. Niebling
*Assistant Examiner*—Jennifer M. Kennedy
(74) *Attorney, Agent, or Firm*—Crompton, Seager & Tufte, LLC

(57) ABSTRACT

The invention relates to a method for fabricating a capacitor of a semiconductor device including the steps of: forming storage nodes for being connected with predetermined portions of a semiconductor substrate; forming a surface nitride layer by performing a surface nitrification process for preventing formation of an oxide layer on the surface of the storage nodes that deteriorates dielectric characteristic of the layer; forming an alumina ($Al2O3$) layer as a dielectric layer on the surface nitride layer in a perovskite structure with superior electrical and mechanical strength; and forming a plate electrode on the dielectric layer, thereby forming a capacitor with capacitance high enough to achieve high integration of the semiconductor device.

6 Claims, 1 Drawing Sheet

METHOD FOR FABRICATING CAPACITOR OF SEMICONDUCTOR DEVICE

BACKGROUND OF THE INVENTION

1. Field of the Invention

The present invention relates to a method for fabricating a semiconductor device, and more particularly to a method for fabricating a capacitor of a semiconductor device having a dielectric layer with higher dielectric characteristic than a conventional nitride/oxide deposition structure of a dielectric layer by forming an alumina (A2O3) layer in a perovskite structure (Al+B5+O3) of superior electrical and mechanical strength.

2. Description of the Prior Art

As integration of a semiconductor memory device gets higher, the size of cells gets smaller. Therefore, it is more and more difficult to secure sufficient capacitance that is in proportion to the surface area of storage nodes.

Particularly, in case of a DRAM device constructed with one MOS transistor and capacitor in a unit cell, it is a key factor for high integration of a DRAM device to reduce the size of a chip while capacitance of a capacitor, occupying a large area of a chip, is kept large.

Thus, in order to increase capacitance C of the capacitor indicated by $(\epsilon_0 \times \epsilon_r \times A)/T$ (where, $\epsilon_0$ is a vacuum dielectric constant, $\epsilon_r$ is a dielectric constant of a dielectric layer, A is area of storage nodes, and T is a thickness of the dielectric layer.), there have been a variety of methods such as use of a material with a high dielectric characteristic for a dielectric layer, formation of a thin dielectric layer, or increase in the surface area of storage nodes.

FIG. 1 is a cross-sectional view for illustrating a method for fabricating a capacitor of a semiconductor device in accordance with the prior art. A Ta2O5 layer is deposited for forming a dielectric layer.

First of all, a lower insulating layer 33 is formed on a semiconductor substrate 31. At this time, even if it is not shown in FIG. 1, the lower insulating layer 33 is constructed with device isolation insulating layer, gate oxide layer and gate electrode or bit line. In addition, an insulating material like Boro Phospho Silicate Glass (hereinafter referred to as BPSG) can be also used for formation of the lower insulating layer 33.

Then, a contact mask (not shown) is used for an etching process of forming contact holes 35 to expose impurity diffusion regions at predetermined portions of the substrate 31.

Accordingly, storage nodes 37 are formed for being connected with predetermined portions of the substrate 31 through the contact holes 35.

Furthermore, a dielectric layer is formed in the oxide layer 39/nitride layer 41 deposition structure.

Next, an upper electrode, a plate electrode is formed on the dielectric layer.

Then, an inter-level insulating layer 45 is formed at the top part of the capacitor to further perform the other following processes.

At this time, since the dielectric layer in the deposition structure of oxide layer 39/nitride layer 41 proves unsuitable for a highly integrated semiconductor device, it has been replaced with a Ta2O5 layer in recent years. The Ta2O5 layer is deposited in a LPCVD method with a superior step coverage rate.

However, as the Ta2O5 layer has an unstable stoichiometry, some substitution type Ta vacancy atoms inevitably remain in the dielectric layer due to a difference in the composition ratio of Ta and O. Furthermore, in the process of forming the Ta2O5 dielectric layer, an organic material of Ta(OC2H5)5, a precursor of Ta2O5 and O2 (or N2O) gas are reacted to release co-existing carbon atoms, carbon compounds and water.

Therefore, it is difficult to put the Ta2O5 layer into actual use for the dielectric layer because it increases current leakage of a capacitor and deteriorates dielectric characteristic due to impurities like carbon atoms, ions, radicals remaining in the Ta2O5 dielectric layer 41.

As described above, there is a problem in the conventional method for fabricating a capacitor of a semiconductor device in that it is difficult to actually apply the Ta2O5 dielectric layer for fabrication of a highly integrated semiconductor device due to current leakage and inferior dielectric characteristic.

SUMMARY OF THE INVENTION

Therefore, it is an object of the present invention to solve the aforementioned problem and provide a method for fabricating a capacitor of a semiconductor device, in which a dielectric layer is formed with dielectric characteristic lower than a Ta2O5 layer, but enabling to oppress oxidation reaction occurring at the interface between upper and bottom electrodes through a first stage annealing process, so that an equivalent oxide layer of a dielectric layer is adjusted in thickness of less than 30 angstrom to secure capacitance large enough for high integration to thereby produce a capacitor of a semiconductor device with mechanical and electrical stability.

In order to accomplish the aforementioned objects of the present invention, there is provided a method for fabricating a capacitor of a semiconductor device comprising the steps of: forming storage nodes for being connected with predetermined portions of a semiconductor substrate; forming a surface nitride layer by performing a surface nitrification process to the storage nodes; forming an alumina dielectric layer on the surface nitride layer through a double stage deposition process; and forming a plate electrode on the dielectric layer.

In the method for fabricating a capacitor of a semiconductor device in accordance with the present invention, a dielectric layer is made of an alumnia layer with dielectric characteristic higher than a N/O or O/N/O structure, but lower than Ta2O5 layer, enabling to oppress the oxidation reaction occurring at the interface between upper and bottom electrodes through a first stage annealing process, so that an equivalent oxide layer of a dielectric layer can be adjusted in thickness of less than 30 angstrom to impose high capacitance and that an alumina layer is made as the dielectric layer in a perovskite structure of covalent bonds with high structural stability.

On the other hand, due to unstable stoichiometry of the Ta2O5 layer, there may partially be oxygen vacancy state of substitution type Ta vacancy atoms. Particularly, the number of oxygen vacancies in the Ta2O5 layer can be varied depending on the quantity and bonding state of components, but it is impossible to completely eliminate the oxygen vacancies.

Furthermore, as the Ta2O5 layer has a high oxidation reactivity with a polysilicon or TiN used for upper and bottom electrodes, the oxygen atoms present in the Ta2O5 layer move to the bordering surface to result in an oxide layer of inferior dielectric characteristic and homogeneity.

However, the aforementioned problem can be solved in the present invention by using an aluminum compound for forming a dielectric layer. For instance, at a first stage of the alumina deposition process, an amorphous anumina layer of less than 20 angstrom is placed and annealed for a first stage single-crystallization. Thus, if the alumina layer is formed in a desired thickness, the single-crystallized layer plays a role as a diffusion blocking wall to oxidants, thereby preventing the oxidants from oxidizing the bordering surface with the bottom electrode of a polysilicon layer in the following process.

In consequence, the aforementioned single-crystallization process of the alumina layer fundamentally prevents formation of an oxide layer with inferior dielectric characteristic, as the thickness of an equivalent oxide layer of the capacitor is adjusted less than 30 angstrom. In addition, neither a natural oxide layer elimination process applied to the N/O structure of a capacitor, nor the bottom and the top oxidation processes applied to the O/N/O structure of a capacitor is required to reduce the level of current leakage and secure high capacitance. Also, no low temperature thermal process like in-situ or ex-situ plasma annealing process or ex-situ UV ozone annealing process that has been applied for forming the Ta2O5 layer deposition structure of a capacitor is not required in the present invention.

In other words, an additional oxidation process, which has been required for the substitution type Ta vacancy atoms remaining in the Ta2O5 layer to stabilize unique, unstable stoichiometry, is not needed to prevent current leakage of the dielectric layer.

Furthermore, chemical bonding force of the alumina dielectric layer can also be reinforced by introducing another annealing stage through a high temperature thermal process, so that the single-crystallized alumina layer can prevent deterioration of the physical and chemical properties of the dielectric layer and can impose dielectric characteristic higher than the amorphous alumina layer. As a result, a high quality alumina capacitor can be made with an improved electrical property.

On the other hand, if a capacitor is made of a single-crystallized alumina layer, the level of current leakage gets relatively low due to superior electrical strength of the material itself in comparison with the capacitor made of the Ta2O5 layer.

Particularly, if TiN is used for forming an upper electrode, there will be no more problems relating to the Ta2O5 layer like high current leakage and reduction in the insulation breakdown voltage caused by unstable stoichiometry in the Ta2O5 layer with substitution type Ta vacancy atoms and carbon compounds.

BRIEF DESCRIPTION OF THE DRAWINGS

Objects and aspects of the invention will become apparent from the following description of an embodiment with reference to the accompanying drawings in which.

DETAILED DESCRIPTION OF THE PRESENT INVENTION

Objects and aspects of the present invention will become apparent from the following detailed description of a preferred embodiment with reference to the accompanying drawing.

Figure 2:
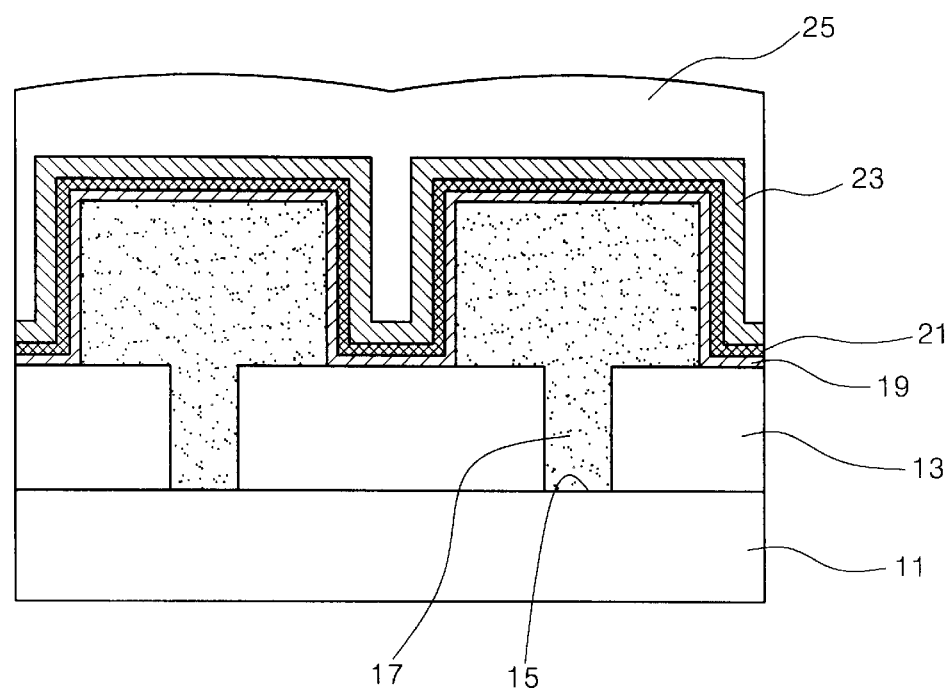
FIG. 2 is a cross-sectional view for illustrating a method for fabricating a capacitor of a semiconductor device in accordance with the present invention.

FIG. 2 is a cross-sectional view for illustrating a method for fabricating a capacitor of a semiconductor device in accordance with the present invention.

Figure 1:
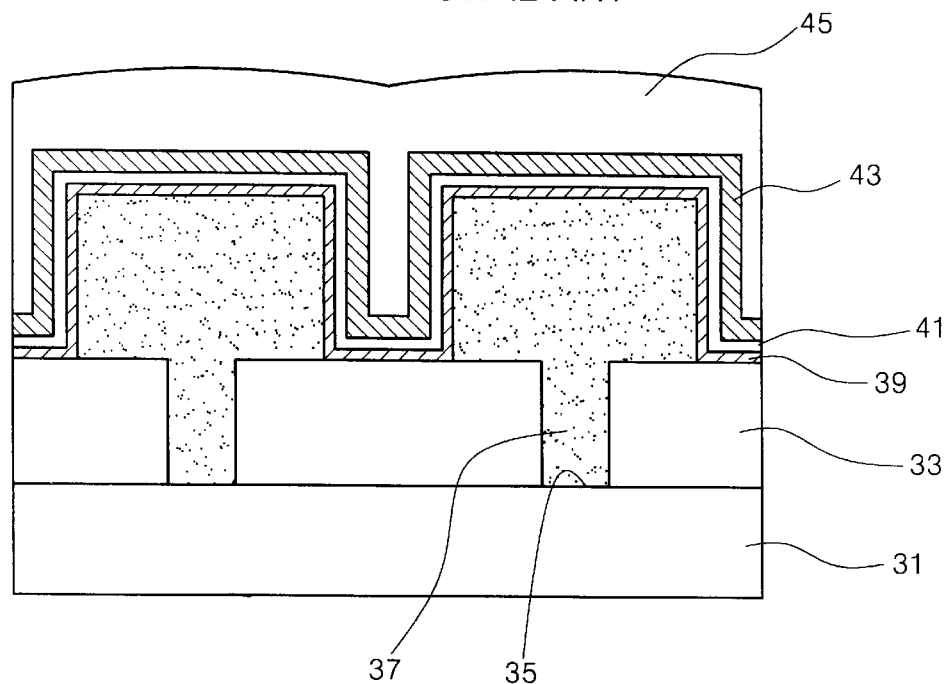
FIG. 1 is a cross-sectional view for illustrating a method for fabricating a capacitor of a semiconductor device in accordance with the prior art.

First of all, even if not shown in FIG. 1, a lower insulating layer 13 is constructed by forming device isolation insulating layer, gate oxide layer and gate electrode or bit line, and depositing BPSG on the substrate 11.

Then, a contact mask (not shown) is used for an etching process of forming storage nodes through contact holes 15 to expose an impurity diffusion region at predetermined portions of the substrate 11.

Accordingly, bottom electrode 17 is formed for being connected with predetermined portions of the substrate 11 through the contact holes 15.

At this time, the bottom electrode 17 can be made of silicon, conductivity oxide or metal layer. In this preferred embodiment, the bottom electrode is made of polysilicon in a LPCVD chamber.

Next, the upper surface of the bottom electrode 17 is nitrified to form a surface nitride layer 19. In the in-situ nitrification process with plasma, the surface nitride layer 19 is formed at the temperature of 200~600 centigrade in nitrogen containing atmosphere like NH3, N2/O2 or N2O gas atmosphere. In another in-situ nitrification process, a rapid thermal nitridation process can be performed at the temperature of 750~950 centigrade in ammonia gas atmosphere for 30 seconds 30 minutes. As a result, the aforementioned nitrification processes prevent formation of an oxide layer with low dielectric characteristic in the following process of depositing an alumina layer.

At this time, the surface nitrification processes can also be performed by annealing plasma in the in-situ process at the temperature of 200~600 centigrade in ammonia gas atmosphere.

Furthermore, the surface nitrification process can also be performed in ammonia gas atmosphere in the rapid thermal nitridation process, or in a low temperature thermal process with plasma in the ex-situ process.

In the in-situ process with plasma, the surface nitrification process can be primarily performed in the ammonia gas atmosphere, or a low temperature thermal process is performed in NO2 or O2 gas atmosphere. As a result, the structural instability or uniformity deteriorated by dangling bonds of the surface nitride layer 19 can be eliminated to make an improvement in its electrical property of current leakage.

On the other hand, before the formation of the surface nitride layer 19 through a surface nitrification process, a washing process can be performed along with the other following processes.

In the process of treating the surface of the storage nodes with HF solution, NH4OH or H2SO4 can be used for washing the bordering surface before and after the process of HF surface treatment to improve the homogeneity of the layer. After the washing process, the silicon nitride layer (not shown) is deposited in thickness of less than 10 angstrom, and the other following processes can be performed immediately.

Next, a surface chemical reaction is made on the surface nitride layer 19 to form an amorphous type alumina layer 21.

At the first stage, the alumina layer 21 is formed by depositing an amorphous alumina layer in thickness of less than 20 angstrom at the temperature of 200~600 centigrade in the LPCVD chamber. Then, a rapid thermal process is performed for annealing and crystallizing the alumina layer 21 at the temperature of 750~950 centigrade in N2O or N2 gas atmosphere for approximately 30~600 seconds to improve dielectric characteristic. At the second stage, on the resultant structure of the first stage, another amorphous alumina layer is deposited in a necessary thickness and a second rapid thermal process is, then, performed for annealing and crystallizing the alumina layer 21 at the temperature of 750~950 centigrade in the N2O or N2 gas atmosphere for approximately 30~600 seconds to improve dielectric characteristic.

At this time, aluminum containing chemical vapor for depositing the aluminum layer can be obtained by evaporating at the temperature of 150~300 centigrade a predetermined quantity of Al(OC2H5)3 solution supplied from vaporizer or evaporation tube through a flow controller like a mass flow controller (MFC).

On the other hand, the alumina layer formed at the first stage of the deposition process plays a role as a diffusion barrier to prevent oxidants like oxygen from diffusing to the storage nodes in the following alumina layer deposition process or other following thermal process.

Furthermore, instead of the rapid thermal process, an electrical furnace can be used for annealing and crystallizing the alumina layer 21 at the temperature of 750~950 centigrade in N2O or N2 gas atmosphere for approximately 10~30 minutes to improve dielectric characteristic.

In order to improve bonding force of components and dielectric characteristic of the alumina layer 21 at the same time, the electrical furnace can also be used for annealing and crystallizing the alumina layer 21 at the temperature of 750~950 centigrade in N2O gas atmosphere for approximately 10~60 minutes.

Then, a plate electrode 23 is formed on the alumina layer 21. The plate electrode 23 may be made of the same material as the storage nodes.

An inter-level insulating layer 25 is formed over all the surface of the resultant structure and the other following processes are performed to complete fabrication of the semiconductor device.

On the other hand, the LPCVD method may be replaced with another widely known deposition method for depositing the alumina layer 21.

As described above, there are advantages in the method for fabricating the capacitor of the semiconductor device of the present invention in that a double stage deposition process is applied for forming an alumina layer of a dielectric layer to impose superior structural, mechanical and electrical properties, wherein an equivalent oxide layer formed by a double state process can be adjusted in thickness of less than 30 angstrom for improving high dielectric characteristic of the layer, to thereby secure capacitance high enough for high integration of a semiconductor device and further improve performances and reliability of the semiconductor device.

What is claimed is:

1. A method for fabricating a capacitor of a semiconductor device comprising the steps of:

forming storage nodes for being connected with one or more predetermined portions of a semiconductor substrate;

washing a surface of a storage node;

forming a surface nitride layer by performing a surface nitrification process on the surface;

forming an alumina dielectric layer on the surface nitride layer through a double stage deposition process;

forming a plate electrode on the alumina dielectric layer; and wherein, the step of washing a surface of a storage node includes:

washing the surface using $NH_4OH$ or $H_2SO_4$ solution; and washing the surface using an HF process.

2. A method for fabricating a capacitor of a semiconductor device comprising the steps of:

forming storage nodes for being connected with one or more predetermined portions of a semiconductor substrate;

forming a surface nitride layer by performing a surface nitrification process on the storage nodes;

forming an alumina dielectric layer on the surface nitride layer through a double stage deposition process;

forming a plate electrode on the alumina dielectric layer; and wherein the alumina layer is formed through a double stage deposition process: at the first stage, depositing an amorphous type alumina layer and annealing and crystallizing it through a rapid thermal process to improve dielectric characteristic; and at the second stage, further depositing another amorphous type alumina layer on the resultant structure of the first stage and annealing and crystallizing it through another rapid thermal process.

3. The method, as defined in claim 2, wherein the first amorphous alumina layer is deposited in thickness of 20 angstrom at the temperature of 200~600 centigrade in a LPCVD chamber.

4. The method, as defined in claim 2, wherein the rapid thermal process is performed at the temperature of 750~950 centigrade in $N_2O$ or $N_2$ gas atmosphere for 30~600 seconds for annealing and crystallizing the alumina layer.

5. The method, as defined in claim 2, wherein, instead of the rapid thermal process, an electrical furnace is used at the temperature of 750~950 centigrade in $N_2O$ or $N_2$ gas atmosphere for approximately 10~30 minutes for annealing the alumina layer.

6. The method, as defined in claim 2, wherein aluminum containing chemical vapor for depositing the alumina layer is obtained by evaporating at the temperature of 150~300 centigrade a predetermined quantity of $Al(OC_2H_5)_3$ solution supplied from a vaporizer or an evaporation tube through a flow controller.

* * * * *